United States Patent
Yu et al.

(10) Patent No.: US 9,784,770 B2
(45) Date of Patent: Oct. 10, 2017

(54) DEVICES AND METHODS OF MEASURING GAIN OF A VOLTAGE-CONTROLLED OSCILLATOR

(71) Applicant: Intel Corporation, Santa Clara, CA (US)

(72) Inventors: Shih-An Yu, Taipei (TW); Yu-Hong Lin, Taipei (TW); Sen-You Liu, Taipei (TW); Fang-Ren Liao, Taipei (TW)

(73) Assignee: Intel Corporation, Santa Clara, CA (US)

( * ) Notice: Subject to any disclaimer, the term of this patent is extended or adjusted under 35 U.S.C. 154(b) by 691 days.

(21) Appl. No.: 14/287,569

(22) Filed: May 27, 2014

(65) Prior Publication Data

US 2015/0346244 A1 Dec. 3, 2015

(51) Int. Cl.
H03L 7/18 (2006.01)
G01R 19/10 (2006.01)
G01R 23/02 (2006.01)
G01R 27/28 (2006.01)
H03L 7/099 (2006.01)
G01R 19/00 (2006.01)
H03L 7/183 (2006.01)

(52) U.S. Cl.
CPC ............ *G01R 19/10* (2013.01); *G01R 23/02* (2013.01); *G01R 27/28* (2013.01); *H03L 7/099* (2013.01); *G01R 19/0023* (2013.01); *H03L 7/183* (2013.01)

(58) Field of Classification Search
CPC ........................................................ H03L 7/18
USPC ..................................................... 331/17, 44
See application file for complete search history.

(56) References Cited

U.S. PATENT DOCUMENTS

| 4,573,026 A | * | 2/1986 | Curtis | H03C 3/0941 |
| | | | | 331/17 |
| 2004/0087285 A1 | * | 5/2004 | Black | H01Q 3/267 |
| | | | | 455/126 |
| 2009/0219100 A1 | | 9/2009 | Pullela et al. | |

FOREIGN PATENT DOCUMENTS

| CN | 1655458 A | 8/2005 |
| CN | 1879304 A | 12/2006 |
| CN | 101931403 A | 12/2010 |
| CN | 102468848 A | 5/2012 |

OTHER PUBLICATIONS

First Office Action received for Chinese Patent Application No. 201410352653.6, mailed on Aug. 15, 2016, 7 pages of Chinese Office Action only.

* cited by examiner

*Primary Examiner* — Joseph Chang
(74) *Attorney, Agent, or Firm* — Schiff Hardin LLP

(57) ABSTRACT

A voltage-controlled oscillator gain measurement system includes a voltage-controlled oscillator, a voltage detector, and a processor. The voltage-controlled oscillator, which is configured in a phase-locked loop circuit, generates an output signal with an output frequency according to a control signal. The control signal is generated according to the output signal divided by a scaling number. The voltage detector is configured to measure a voltage difference of the control signal. The processor adjusts the scaling number to generate an output frequency difference of the output signal, and obtains a reciprocal gain of the voltage-controlled oscillator by dividing the voltage difference by the output frequency difference.

8 Claims, 3 Drawing Sheets

DEVICES AND METHODS OF MEASURING GAIN OF A VOLTAGE-CONTROLLED OSCILLATOR

BACKGROUND OF THE INVENTION

Field of the Invention

The disclosure relates generally to devices and methods of measuring gain of a voltage-controlled oscillator, and more particularly to methods and devices of in situ measuring of gain of a voltage-controlled oscillator of a phase-locked loop circuit.

Description of the Related Art

Many of today's electronic devices (e.g. cell phones, computers, personal digital assistants (PDAs), etc.) require high frequency clock signals in order to operate. Usually, these clock signals are generated using phase locked loops (PLLs).

A typical PLL includes a phase detector, a loop filter, a charge pump, and a voltage-controlled oscillator (VCO). While all of the components perform vital functions, it is really the VCO that is at the heart of the PLL because it is the VCO that provides the output high frequency signals, and it is the VCO that enables the frequencies of the output signals to be adjusted based upon a control voltage signal.

In designing a PLL, one of the starting points is the selection of an (output frequency)/(control voltage) value for the VCO. This gain, referred to herein after as $K_{VCO}$, specifies how much the output frequency of the VCO will change given a change in control voltage. In practice, the $K_{VCO}$ will most likely vary with the control voltage and hence, would not be a constant. Nonetheless, to simplify the design process, a constant $K_{VCO}$ value is used as an approximation. After the $K_{VCO}$ value is selected, it is used to determine the parameters of the other PLL components. The $K_{VCO}$ value affects the performances of the PLL, such as the transfer function and frequency response of the PLL. In this manner, the PLL is designed basing on the VCO.

The $K_{VCO}$ value that is selected for a PLL depends upon the particular VCO that is to be used. This variety of $K_{VCO}$ values results not from any defect in the design of the VCO, but rather from the processing variations that are encountered in fabricating the VCO.

More specifically, a VCO includes a plurality of components (e.g. transistors). These components are manufactured by some fabrication process. Ideally, the fabrication process should produce identical components (components with the same parameters) each and every time. In practice, however, this is not possible. As a result, there will be some variation in the parameters of the components used to make up the VCO. Some of the components will have parameters that barely meet minimum specifications, while other components will meet or exceed the maximum specifications, while other components will fall somewhere in between. Because of these processing variations, the $K_{VCO}$ values exhibited by different VCOs will differ, even if the VCO's are all of the identical design. In addition, the reciprocal of the $K_{VCO}$ value is needed when designing a compensation filter for a PLL, which requires additional efforts due to the division operation. This means that we need an effective device and method to measure the reciprocal of the $K_{VCO}$ values of VCO in a PLL.

BRIEF SUMMARY OF THE INVENTION

For solving the above problems, the invention provides a measurement device and method for measuring gain of a voltage-controlled oscillator.

In one embodiment, a voltage-controlled oscillator gain measurement system comprises a voltage-controlled oscillator, a voltage detector, and a processor. The voltage-controlled oscillator, which is configured in a phase-locked loop circuit, generates an output signal with an output frequency according to a control signal. The control signal is generated according to the output signal divided by a scaling number. The voltage detector is configured to measure a voltage difference of the control signal. The processor adjusts the scaling number to generate an output frequency difference of the output signal, and obtains a reciprocal gain of the voltage-controlled oscillator by dividing the voltage difference by the output frequency difference.

In an embodiment of the voltage-controlled oscillator gain measurement system, the phase-locked loop circuit further comprises a frequency divider. The frequency divider, which is coupled to the processor, generates a feedback signal with a feedback frequency according to the output signal. The feedback frequency equals the output frequency divided by the scaling number.

In an embodiment of the voltage-controlled oscillator gain measurement system, the phase-locked loop circuit further comprises a phase detector, a charge pump, and a filter. The phase detector, which coupled to the frequency divider, generates an up/down signal by comparing a reference signal and the feedback signal. The charge pump, which is coupled to the phase detector, receives the up/down signal to generate a current signal. The filter, which is coupled to the charge pump, receives the current signal to generate the control signal.

In an embodiment of the voltage-controlled oscillator gain measurement system, the voltage detector is a differential analog-to-digital converter.

In an embodiment of the voltage-controlled oscillator gain measurement system, the voltage-controlled oscillator gain measurement system further comprises a switch. The switch, which switched by the processor, couples the control signal to a first node of the voltage detector to measure a first voltage and couples the control signal to a second node of the voltage detector to measure a second voltage. The voltage difference is the difference between the first voltage and the second voltage.

In an embodiment, a method of measuring a gain of a voltage-controlled oscillator, which is configured in a phase-locked loop circuit, comprises adjusting a scaling number to generate an output signal with a frequency of an output frequency plus an output frequency difference, measuring a first voltage of a control signal, adjusting the scaling number to generate the output signal with a frequency of the output frequency, measuring a second voltage of the control signal, and dividing a voltage difference between the first voltage and the second voltage by the output frequency difference to obtain the reciprocal of the gain of the voltage-controlled oscillator. The control signal is generated according to the output signal divided by the scaling number. The output signal is generated according to the control signal.

In an embodiment of the method of measuring a gain of a voltage-controlled oscillator, the method further comprises controlling, by a processor, a frequency divider of the phase-locked loop circuit to adjust the scaling number.

In an embodiment of the method of measuring a gain of a voltage-controlled oscillator, the control signal is generated by a phase detector, a charge pump, and a filter, wherein an up/down signal is generated by the phase detector comparing a reference signal and a feedback signal, a current signal is generated by the charge pump according to the up/down signal, and the control signal is generated according to the current signal by the filter, and wherein the frequency divider generates the feedback signal by dividing the output signal by the scaling number.

In an embodiment of the method of measuring a gain of a voltage-controlled oscillator, the voltage difference is measured by a differential analog-to-digital converter.

In an embodiment of the method of measuring a gain of a voltage-controlled oscillator, the method further comprises coupling, by a switch switched by a processor, the control signal to a first node of a voltage detector to measure the first voltage, and coupling, by the switch switched by the processor, the control signal to a second node of the voltage detector to measure the second voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
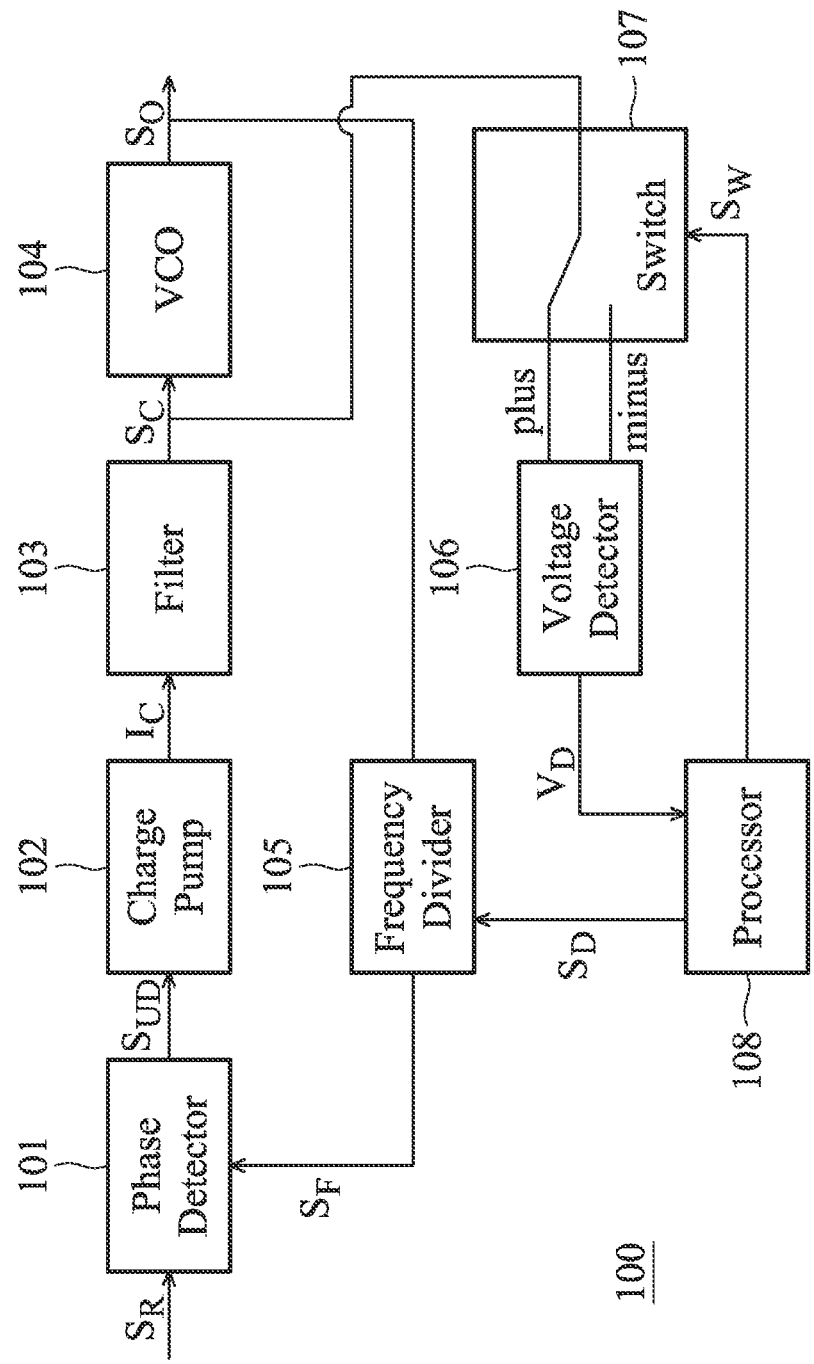
FIG. 1 is a block diagram of an embodiment of measuring the gain $K_{VCO}$ of the voltage-controlled oscillator in a phase-locked loop circuit.

FIG. 1 is a block diagram of an embodiment of measuring the gain $K_{VCO}$ of the voltage-controlled oscillator in a phase-locked loop circuit. As shown in FIG. 1, the phase-locked loop circuit 100 includes the phase detector 101, the charge pump 102, the filter 103, the voltage-controlled oscillator (VCO) 104, the frequency divider 105, the voltage detector 106, the switch 107, and the processor 108. The phase detector 101 receives the reference signal $S_R$ with the reference frequency $F_R$ and the feedback signal $S_F$ with the feedback frequency $F_F$ to generate the up/down signal $S_{UD}$ for the charge pump 102. The charge pump 102 receives the up/down signal $S_{UD}$ to generate the current signal $I_C$ with the current I. The filter 103 converts the current signal $I_C$ to the control signal $S_C$.

The VCO 104 receives the control signal $S_C$ to generate the output signal $S_O$ with the output frequency $F_O$. The frequency divider 105 receives the output signal $S_O$ to generate the feedback signal $S_F$, in which the frequency divider 105 divides the output frequency $F_O$ by the scaling number which is controlled by the processor 108 via the division signal $S_D$. In spite of setting the scaling number of the frequency divider 105, the processor 108 further switches the control signal $S_C$ into the plus node or the minus node of the voltage detector 106, and the voltage detector 106 then sends the voltage difference between the plus node and the minus node $V_D$ back to the processor 108.

According to an embodiment of the invention, when the phase detector 101 detects that the reference frequency $F_R$ is greater than the feedback frequency $F_F$, the phase detector 101 sends the up/down signal $S_{UD}$ to the charge pump 102 for decreasing the current value of the current signal $I_C$. When the phase detector 101 detects that the reference frequency $F_R$ is less than the feedback frequency $F_F$, the phase detector 101 sends the up/down signal $S_{UD}$ to the charge pump 102 for increasing the current value of the current signal $I_C$. In an embodiment of the invention, the filter includes a resistor which converts the current signal $I_C$ into the control signal $S_C$ with a voltage level when the current signal $I_C$ flows through. Namely, the purpose of the phase-locked loop circuit 100 is to keep the feedback frequency $F_F$ equal to the reference frequency $F_R$, and the output frequency $F_O$ is the feedback frequency $F_F$ multiplied by the scaling number of the frequency divider 105, which is provided by the processor 108. Those skilled in the art may use well known PLL circuits for the phase detector 101, the charge pump 102, the filter 103, the VCO 104, and the frequency divider 105 in accordance with the principles of the present invention.

When the processor 108 provides different scaling numbers, it results in a different control signal $V_C$ and a different output frequency $F_O$. In order to precisely measure the gain $K_{VCO}$ of the VCO 104, the processor 108 provides a first scaling number of the frequency divider 105 by the division signal $S_D$, and it results in the control signal $S_C$ with a first voltage $V_1$ and the output frequency $F_O$ with a first output frequency $F_{O1}$. After the phase-locked loop circuit 100 is stable (i.e., becomes locked at steady state), the processor 108 switches the switch 107 to pass the first voltage $V_1$ of the control signal $S_C$ to the plus node of the voltage detector 106.

Then, the processor 108 further provides a second scaling number of the frequency divider 105, and it results in the control signal $S_C$ with a second voltage $V_2$ and the output frequency $F_O$ with a second output frequency $F_{O2}$. After the phase-locked loop circuit 100 is stable, the processor 108 switches the switch 107 to pass the second voltage $V_2$ of the control signal $S_C$ to the minus node of the voltage detector 106. The voltage detector 106 measures the voltage difference $V_D$ of the first voltage $V_1$ and the second voltage $V_2$ and sends the voltage difference $V_D$ to the processor 108. The second output frequency $F_{O2}$ is designed to differ from the first output frequency $F_{O1}$ by a predetermined frequency difference $\Delta F_O$ which is determined according to the difference between the second scaling number and first scaling number. In one embodiment, the second output frequency $F_{O2}$ may be designed to be the desired output frequency $F_O$ of the PLL, so that the PLL has steady-state output immediately after the gain measurement and does not require additional time to further lock to a desired output frequency.

Because the output frequency $F_O$ varies according to the first and second scaling numbers of the frequency divider 105 which are controlled by the processor 108, the processor 108 can easily deduce the gain $K_{VCO}$ after the voltage difference $V_D$ is received.

In an embodiment of the invention, the processor 108 deduces the reciprocal of the gain $1/K_{VCO}$ (by $V_D/\Delta F_O$) which would be easily used for the design of compensation filters for the PLL circuit. Since the measured value (the voltage difference $V_D$) is in the numerator and the denominator is a predetermined value (the frequency difference $\Delta F_O$; the multiplication by $1/\Delta F_O$ is also a predetermined value), no additional efforts due to division operations on the measured value are required, which simplifies the system design. In an embodiment of the invention, the voltage detector 106 is a differential analog-to-digital converter (ADC). A common differential ADC differs from a regular single-ended ADC in that a differential ADC measures the voltage difference between two pins (the plus and minus node) while a regular single-ended ADC measures the voltage difference between one pin and ground (i.e., the minus node is coupled to ground). Those skilled in the art may use well known ADC circuits for the differential ADC circuit.

Figure 2:
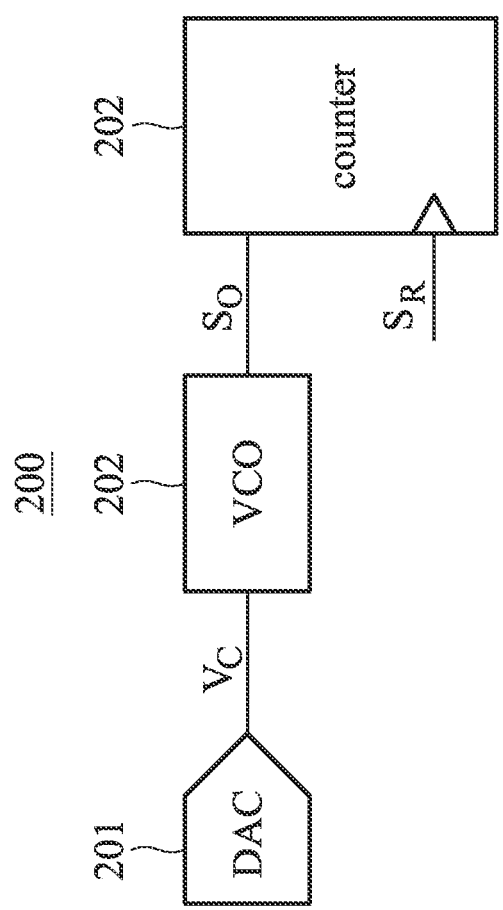
FIG. 2 is a block diagram of the conventional device for measuring the gain $K_{VCO}$ of the voltage-controlled oscillator.

FIG. 2 is a block diagram of the conventional device for measuring the gain $K_{VCO}$ of the voltage-controlled oscillator. As shown in FIG. 2, the conventional device 200 includes the digital-to-analog converter (DAC) 201, the measured voltage-controlled oscillator (VCO) 202, and the frequency counter 203.

The DAC 201 is configured to set the control voltage $V_C$. The VCO 202 generates the output signal $S_O$ with the output frequency $F_O$ responding to the received control voltage $V_C$. The frequency counter 203 measures the output frequency $F_O$ by comparing with the reference frequency $F_R$. The gain $K_{VCO}$ can be obtained by a processor with eq. 1, where $V_1$ and $V_2$ are given values of the control voltage $V_C$ and $F_1$ and $F_2$ are the measured frequencies corresponding to $V_1$ and $V_2$, respectively.

$$K_{VCO} = \frac{F_2 - F_1}{V_2 - V_1} \quad \text{(eq. 1)}$$

Since the measured values ($F_1$ and $F_2$) will be in the denominator when calculating the reciprocal of the gain $1/K_{VCO}$, additional circuits for performing division operations on the measured values are required, which are more complicated than multiplication circuits and are thus detrimental to the design of compensation filters for the PLL circuit. In addition, since the gain measurement is not in situ, the VCO is separated from the PLL circuit during measurement and thus not only the accuracy is compromised but also additional time is required to further lock to the desired output frequency of the PLL after gain measurement. In an embodiment of the invention, for example, the output frequency $F_O$ of the VCO 202 is at 3.6 GHz and the nominal $K_{VCO}$ is around 20 MHz/V (that is determined while designing the VCO), and that the variation of the control voltage $V_C$ should be sufficiently small to keep the $K_{vco}$ linear. When the voltage difference of the control voltage $V_C$ is 0.1V, the frequency difference is only 2 MHz compared with the 3600 MHz carrier. To achieve a $K_{VCO}$ measurement error within 1%, the frequency difference must thus be measured with 0.02 MHz accuracy. To achieve 0.02 MHz accuracy, the frequency counter 203 needs the reference frequency $F_R$ to be 3.6 GHz and takes at least 50 us to measure the output frequency $F_O$. The measurement process would be: tuning the output frequency $F_O$ corresponding to the control voltage $V_1$ (10 us), measuring the first output frequency $F_1$ (50 us), and measuring the second output frequency $F_2$ (50 us). That is, it takes more than 110 us to measure the $K_{VCO}$ of the VCO 202 in the conventional method. When the VCO 202 is operated in a PLL circuit, the VCO 202 must be isolated to measure the $K_{VCO}$ and then further wait for the PLL circuit to reach steady state after the measurement, which takes extra time.

In addition, when we want to precisely control the voltage value of the control voltage $V_C$, the output voltage of the DAC 201 must have high resolution since the variation of the control voltage $V_C$ should be sufficiently small. It is obvious that, for a given resolution, measuring a voltage difference as in FIG. 1 can be much more accurate than providing a voltage value by a DAC as in FIG. 2, especially when the voltage difference is more or less predictable. Therefore, the embodiment of FIG. 1 has the following benefits: (1) if the measurement is done in situ in the PLL, the results are more accurate and stable; (2) The measurement process is embedded in the PLL circuit and the locking is already achieved right after the second sampling, and thus no additional time is required for locking the PLL circuit to a desired output frequency; (3) The voltage detector 106 (e.g., a differential ADC) directly measures the voltage difference of the control signal $S_C$ of the two locked states, which greatly reduces the dynamic-range requirement of the ADC; and (4) The output data is proportional to the reciprocal of the $K_{VCO}$, which is in a more convenient format to obtain the reciprocal of the gain of the PLL circuit when designing compensation filters. Namely, with the device and the method provided by the embodiment of FIG. 1, $K_{VCO}$ can be measured in a more stable, accurate, and time-saving way.

Figure 3:
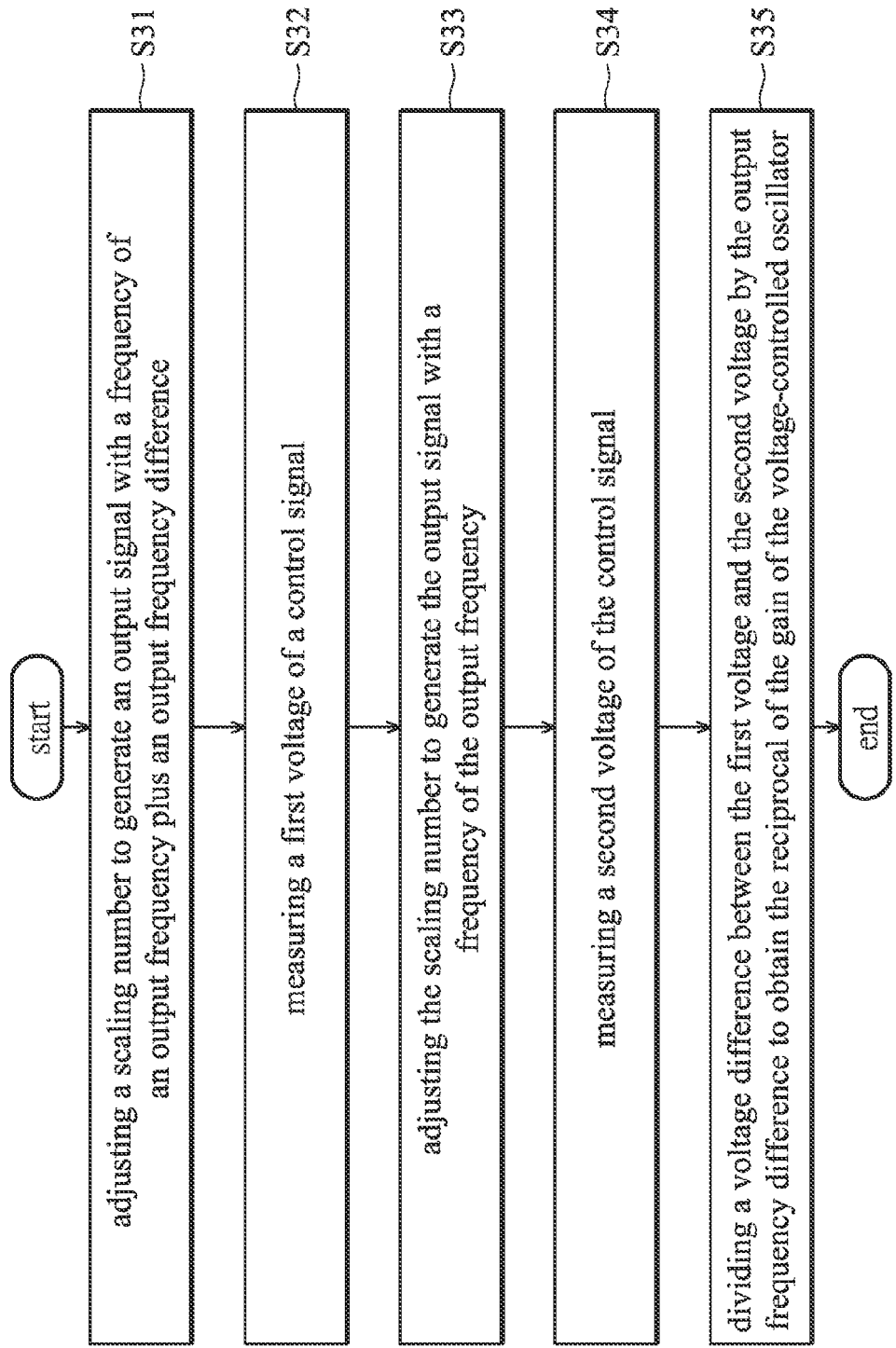
FIG. 3 is a flow chart of the embodiment in FIG. 1 of measuring the gain $K_{VCO}$ of the voltage-controlled oscillator in a phase-locked loop circuit.

FIG. 3 is a flow chart of the embodiment in FIG. 1 of measuring the gain $K_{VCO}$ of the voltage-controlled oscillator in a phase-locked loop circuit. FIG. 3 herein is illustrated according to FIG. 1. In the beginning, the scaling number of the frequency divider 105 is adjusted so that the output signal $S_O$ of the PLL is locked to a desired output frequency $F_O$ plus a predetermined frequency difference $\Delta F_O$ (Step S31). The first voltage $V_1$ of the control signal $S_C$ is measured (Step S32). The scaling number of the frequency divider 105 is adjusted so that the output signal $S_O$ of the PLL is locked to a desired output frequency $F_O$ (Step S33). The second voltage $V_2$ of the control signal $S_C$ is measured (Step S34). The reciprocal of the $K_{VCO}$ value is obtained by dividing the voltage difference $V_2-V_1$ by the predetermined frequency difference $\Delta F_O$ (i.e., multiplying by $1/\Delta F_O$ which is also a predetermined value) (Step S35). In an embodiment of the invention, the voltage difference $V_2-V_1$ is measured by a differential analog-to-digital converter (ADC).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A voltage-controlled oscillator gain measurement system, comprising: a voltage-controlled oscillator, configured in a phase-locked loop circuit, generating an output signal with an output frequency according to a control signal, wherein the control signal is generated according to the output signal divided by a scaling number; a voltage detector that is a differential analog-to-digital converter, configured to measure a voltage difference of the control signal; and a processor adjusting the scaling number to generate an output frequency difference of the output signal, and obtaining a reciprocal gain of the voltage-controlled oscillator by dividing the voltage difference by the output frequency difference.

2. The voltage-controlled oscillator gain measurement system of claim 1, wherein the phase-locked loop circuit further comprises: a frequency divider, coupled to the processor, generating a feedback signal with a feedback frequency according to the output signal, wherein the feedback frequency equals the output frequency divided by the scaling number.

3. The voltage-controlled oscillator gain measurement system of claim 2, wherein the phase-locked loop circuit further comprises: a phase detector, coupled to the frequency divider, generating an up/down signal by comparing a reference signal and the feedback signal; a charge pump, coupled to the phase detector, receiving the up/down signal to generate a current signal; and a filter, coupled to the charge pump, receiving the current signal to generate the control signal.

4. The voltage-controlled oscillator gain measurement system of claim 1, further comprising: a switch, switched by the processor, coupling the control signal to a first node of the voltage detector to measure a first voltage and coupling the control signal to a second node of the voltage detector to measure a second voltage, wherein the voltage difference is the difference between the first voltage and the second voltage.

5. A method of measuring a gain of a voltage-controlled oscillator configured in a phase-locked loop circuit, comprising:
adjusting a scaling number to generate an output signal with a frequency of an output frequency plus an output frequency difference; measuring a first voltage of a control signal; adjusting the scaling number to generate the output signal with a frequency of the output frequency; measuring a second voltage of the control signal; and dividing a voltage difference that is measured by a differential analog-to-digital converter between the first voltage and the second voltage by the output frequency difference to obtain the reciprocal of the gain of the voltage-controlled oscillator, wherein the control signal is generated according to the output signal divided by the scaling number, wherein the output signal is generated according to the control signal.

6. The method of claim 5, further comprising: controlling, by a processor, a frequency divider of the phase-locked loop circuit to adjust the scaling number.

7. The method of claim 6, wherein the control signal is generated by a phase detector, a charge pump, and a filter, wherein an up/down signal is generated by the phase detector comparing a reference signal and a feedback signal, a current signal is generated by the charge pump according to the up/down signal, and the control signal is generated according to the current signal by the filter, and wherein the frequency divider generates the feedback signal by dividing the output signal by the scaling number.

8. The method of claim 5, further comprising: coupling, by a switch switched by a processor, the control signal to a first node of a voltage detector to measure the first voltage; and coupling, by the switch switched by the processor, the control signal to a second node of the voltage detector to measure the second voltage.

* * * * *